United States Patent
Sass et al.

(10) Patent No.: US 8,425,237 B2
(45) Date of Patent: Apr. 23, 2013

(54) SOCKET HAVING HEAT-DISSIPATING VENTS

(75) Inventors: Tony C. Sass, Fuquay Varina, NC (US); Brian Littell, Stuart, VA (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 12/880,092

(22) Filed: Sep. 11, 2010

(65) Prior Publication Data
US 2012/0064737 A1    Mar. 15, 2012

(51) Int. Cl.
*H01R 12/00*    (2006.01)
(52) U.S. Cl.
USPC ............................................. 439/62
(58) Field of Classification Search ............ 439/62, 439/152, 157–158, 326–327, 630–637; 29/846, 29/428, 830, 876
See application file for complete search history.

(56) References Cited

U.S. PATENT DOCUMENTS

| | | | |
|---|---|---|---|
| 4,364,620 A | 12/1982 | Mulholland et al. | |
| 4,550,959 A | 11/1985 | Grabbe et al. | |
| 5,419,712 A * | 5/1995 | Bellomo et al. | 439/327 |
| 5,511,985 A * | 4/1996 | Noschese et al. | 439/157 |
| 6,619,973 B2 * | 9/2003 | Perino et al. | 439/327 |
| 7,226,298 B1 | 6/2007 | Minich | |
| 7,303,443 B1 | 12/2007 | Beaman et al. | |
| 7,384,289 B2 | 6/2008 | Minich | |
| 7,520,781 B2 | 4/2009 | Clayton et al. | |
| 7,537,487 B2 | 5/2009 | Shan et al. | |
| 7,632,127 B2 | 12/2009 | Beaman et al. | |
| 2009/0130909 A1 | 5/2009 | Zaderej et al. | |
| 2009/0142953 A1 | 6/2009 | Patel et al. | |

OTHER PUBLICATIONS

P.Hoang., "Thermal concepts enhance DRAM memory subsystem designs." Embedded Computing Design, May 14, 2008, http://embedded-computing.com/thermal-memory-subsystem-designs.

* cited by examiner

*Primary Examiner* — Jean F Duverne
(74) *Attorney, Agent, or Firm* — Steven L. Bennett

(57) ABSTRACT

A socket receptive to insertion of an integrated circuit (IC) printed circuit board (PCB) includes a housing, conductors, and vents. The housing has first and second sides corresponding to a length of the IC PCB. The conductors are mounted within the housing to mate with corresponding conductors of the IC PCB upon insertion of the IC PCB into the housing, and have leads adapted to being soldered to corresponding conductors of a host PCB. The vents are within the housing and are adapted to dissipate heat resulting from soldering the leads to the host PCB to minimize warping of the housing during soldering. The vents are further adapted to compensate for a mismatch between a coefficient of thermal expansion (CTE) of the housing and a CTE of the host PCB during soldering, regardless of the CTE of the host PCB.

17 Claims, 6 Drawing Sheets

SOCKET HAVING HEAT-DISSIPATING VENTS

BACKGROUND

The primary printed circuit board (PCB) of a computing device, which may be referred to as a motherboard or a mainboard, typically includes a number of sockets that are receptive to insertion of other integrated circuit (IC) PCBs, such as memory modules, graphics cards, and so on. A socket generally has a number of leads that are soldered to corresponding conductors of the primary PCB. The leads are part of, or are attached to, conductors of the socket itself. Insertion of an IC PCB into the socket results in the conductors of the socket mating with corresponding conductors of the IC PCB.

SUMMARY OF THE INVENTION

A socket of an embodiment of the invention is receptive to insertion of an integrated circuit (IC) printed circuit board (PCB). The socket includes a housing having a first side and a second side. The first side and the second side correspond to a length of the IC PCB. The socket includes conductors mounted within the housing to mate with corresponding conductors of the IC PCB upon insertion of the IC PCB into the housing. The conductors have leads adapted to being soldered to corresponding conductors of a host PCB different than the IC PCB. The socket includes vents within the housing. The vents are adapted to dissipate heat resulting from soldering the leads to the host PCB to minimize warping of the housing during soldering of the leads to the host PCB. The vents are further adapted to compensate for a mismatch between a coefficient of thermal expansion (CTE) of the housing and a CTE of the host PCB during soldering of the leads to the host PCB, regardless of the CTE of the host PCB.

An electronic assembly of an embodiment of the invention includes a host PCB and a socket. The host PCB has conductors, and the socket is receptive to insertion of an IC PCB and comprising. The socket includes a housing having a first side and a second side. The first side and the second side correspond to a length of the IC PCB. The socket includes conductors mounted within the housing to mate with corresponding conductors of the IC PCB upon insertion of the IC PCB into the housing. The conductors of the socket have leads soldered to the conductors of the host PCB. The socket includes vents within the housing. The vents are adapted to dissipate heat resulting from soldering the leads to the host PCB to minimize warping of the housing during soldering of the leads to the host PCB. The vents are further adapted to compensate for a mismatch between a CTE of the housing and a CTE of the host PCB during soldering of the leads to the host PCB, regardless of the CTE of the host PCB.

A method of an embodiment of the invention includes fabricating a housing of a socket receptive to insertion of an IC PCB. The housing has a first side and a second side. The first side and the second side correspond to a length of the IC PCB. The method includes mounting conductors within the housing. The conductors are to mate with corresponding conductors of the IC PCB upon insertion of the IC PCB into the housing. The conductors have leads adapted to being soldered to corresponding conductors of a host PCB different than the IC PCB. The method includes forming vents within the housing. The vents are adapted to dissipate heat resulting from soldering the leads to the host PCB to minimize warping of the housing during soldering of the leads to the host PCB. The vents are further adapted to compensate for a mismatch between a CTE of the housing and a CTE of the host PCB during soldering of the leads to the host PCB, regardless of the CTE of the host PCB.

BRIEF DESCRIPTION OF THE SEVERAL VIEWS OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION

Figure 1:
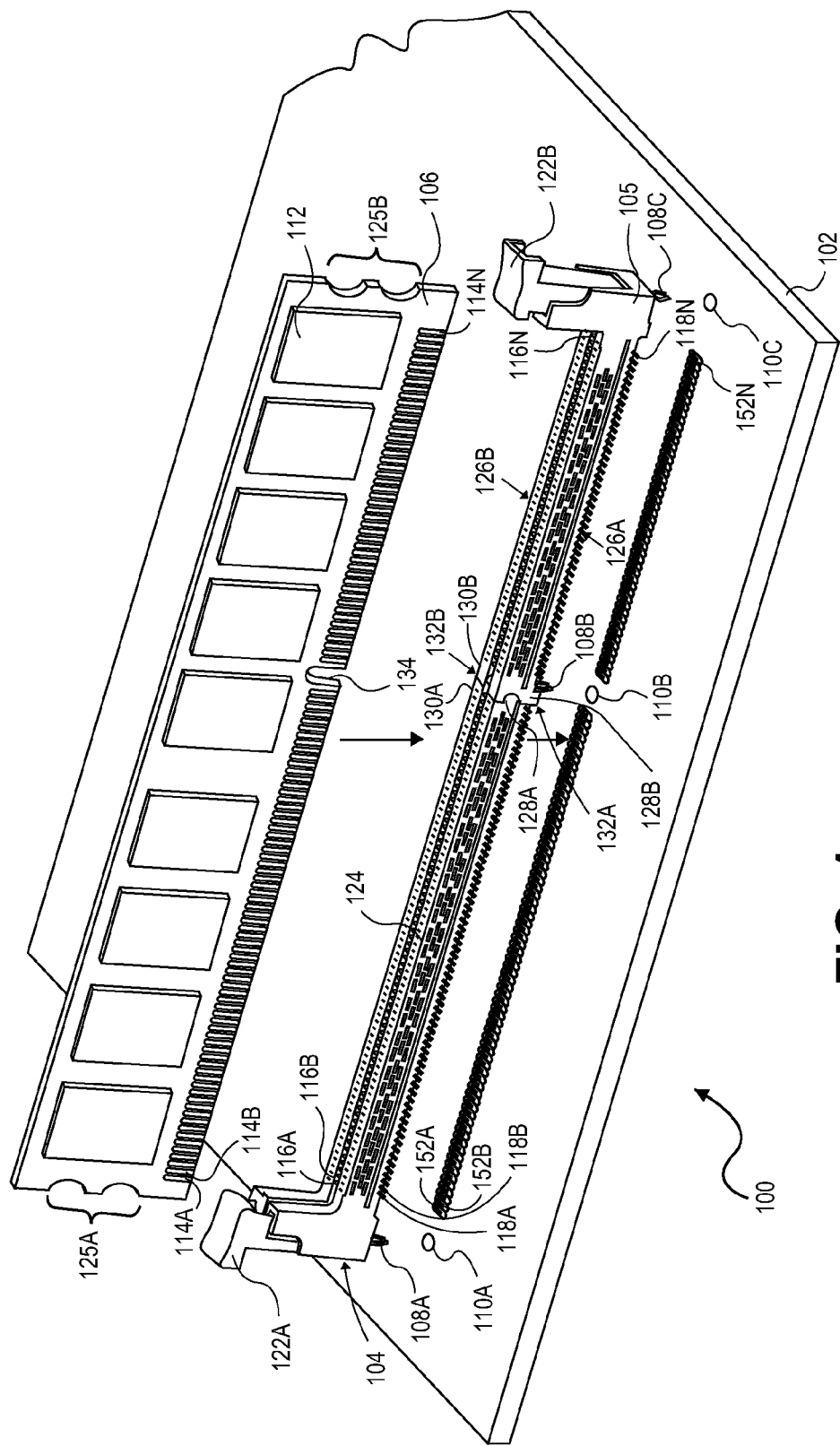
FIG. 1 is a diagram of an electronic assembly including a socket having vents, according to an embodiment of the invention.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

As noted in the background section, the primary, or host, printed circuit board (PCB) of a computing device typically includes a number of sockets that are receptive to insertion of other integrated circuit (IC) PCBs. A socket is electrically connected to the host PCB by soldering leads of the socket to corresponding conductors of the host PCB. Prior to soldering the leads of the socket to the host PCB, the socket is typically physically attached to the host PCB, such as by securing the socket to the host PCB via harpoon connectors of the socket being inserted into corresponding holes of the host PCB.

Soldering the leads of a socket to corresponding conductors of the host PCB can entail subjecting both the socket and the host PCB to relatively high temperatures. The coefficient of thermal expansion (CTE) of the socket is typically different than the CTE of the host PCB. As such, because the socket is physically attached to the host PCB and is smaller in size than the host PCB, the socket may warp when exposed to these high temperatures.

To reduce or prevent the socket from warping, a number of different solutions can be employed. First, the socket may be fabricated from a material that has a CTE matching the CTE of the host PCB. However, this solution is disadvantageous, because host PCBs can have a wide variety of different CTEs, which inhibits the use of the same socket on different host PCBs.

Second, a mechanical fixture may be attached to the host PCB during soldering, to act as a heat sink. Third, a mechanical fixture may be attached to the host PCB and/or the socket during soldering, to additionally or instead inhibit the socket from warping. These solutions are also disadvantageous, however, because they add processing steps to the assembly or fabrication of the host PCB: the attachment of the mechanical fixture to the host PCB before soldering, and the removal of the fixture after soldering.

Embodiments of the invention, by comparison, reduce or prevent a socket from warping during soldering of the socket to a host PCB, in ways that overcome these disadvantages. In one embodiment, a housing of the socket includes a number of vents. The vents are adapted to dissipate heat resulting from soldering the socket to the host PCB, to minimize warping of the housing during such soldering. The vents are further adapted to compensate for a mismatch between the CTE of the housing and the CTE of the host PCB during soldering, regardless of the CTE of the host PCB.

In a second embodiment, the housing of the socket includes first interlocking components that form a first side of the housing, and second interlocking components that form a second side of the housing. These interlocking components are adapted to further minimize warping of the housing as a whole during soldering of the socket to the host PCB. This is because each interlocking component independently warps during soldering, resulting from the lengths of the first and second sides of the housing influenced by the mismatch between the CTE of the housing and the CTE of the host PCB are effectively shortened. The lengths of the first and second sides are effectively shortened due to their each being made up of interlocking, but separate, components. The interlocking components thus further compensate for any mismatch between the CTE of the housing and the CTE of the host PCB during soldering, regardless of the CTE of the host PCB.

In a third embodiment, a material is formed within the vents of the housing. For example, the material may be injected within the vents of the housing. The material has a CTE tuned to the CTE of the host PCB to further minimize warping of the housing during soldering of the socket to the host PCB.

FIG. 1 shows an electronic assembly 100, according to an embodiment of the invention. The electronic assembly 100 includes a host PCB 102, a socket 104 affixable to the host PCB 102, and an IC PCB 106 removably insertable into the socket 104. The IC PCB 106 has one or more ICs, such as the IC 112. The IC PCB 106 may be a memory module in one embodiment, such as a single inline memory module (SIMM) or a dual inline memory module (DIMM).

Insertion of the IC PCB 106 into the socket 104 results in conductors 114A, 114B, . . . , 114N of the IC PCB 106, which are collectively referred to as the conductors 114, mating with conductors 116A, 116B, . . . , 116B of the socket 104, which are collectively referred to as the conductors 116. As such, the conductors 114 and the conductors 116 make electrical contact with one another. The conductors 116 of the socket 104 are mounted within a housing 105 of the socket 104.

The socket 104 includes releasable locks 122A and 122B, collectively referred to as the releasable locks 122, which are movably attached within the housing 105. To insert the IC PCB 106 into the socket 104, the locks 122 are rotated away from one another. Insertion of the IC PCB 106 into the socket 104 then results in the locks 122 rotating towards one another, as is depicted in FIG. 1. The locks 122 engage corresponding notches 125A and 125B of the IC PCB 106, which are collectively referred to as the notches 125. As such, the IC PCB 106 is secured within the socket 104. To remove the IC PCB 106 from the socket 104, the locks 122 are again rotated away from one another so that the IC PCB 106 can be pulled from the socket 104. It is noted, however, that in other embodiments, the socket 104 may not include releasable locks 122, such that the PIC PCB 106 is secured within the socket 104 in a manner other than through the use of such releasable locks 122.

The conductors 116 of the socket 104 have leads 118A, 118B, . . . , 118N, collectively referred to as the leads 118. Furthermore, the socket 104 includes connectors 108A, 108B, . . . 108C, collectively referred to as the connectors 108. The connectors 108 in the embodiment of FIG. 1 are harpoon connectors that are each made up of a number of prongs.

To attach the socket 104 to the host PCB 102, the connectors 108 are inserted into and thus mate with corresponding holes 110A, 110B, and 110C of the host PCB 102, which are collectively referred to as the holes 110. The connectors 108 physically affix the socket 104 to the PCB 102. It is noted, however, that in other embodiments, the socket 104 may be attached to the host PCB 102 in a manner other than the harpoon connectors 108 as depicted in FIG. 1. The leads 118 in the embodiment of FIG. 1 are then soldered to corresponding conductors 152A, 152B, . . . , 152N on host PCB 102, which are collectively referred to as the conductors 152. As such, the host PCB 102 makes electrical contact with the socket 104, and thus with the IC PCB 106 that is subsequently inserted into the socket 104.

The housing 105 of the socket 104 includes a number of vents 124, one of which is explicitly called out in FIG. 1. The vents 124 are adapted to dissipate heat resulting from soldering the leads 118 to the host PCB 102, to minimize warping of the housing 104 during such soldering. Furthermore, and as such, the vents are adapted to compensate for a mismatch between the CTE of the housing 105 and the CTE of the host PCB 102 during soldering of the leads 118 to the host PCB 102, regardless of the CTE of the host PCB 102. Therefore, in some embodiments, the same socket 104 can be employed regardless of the CTE of the host PCB 102, without having to ensure that the CTE of the housing 105 matches or is tuned to the CTE of the host PCB 102.

The housing 105 of the socket 104 has a first side 126A and a second side 126B, which are collectively referred to as the sides 126 of the housing 105. In the embodiment of FIG. 1, the first side 126A is made up of interlocking components 128A and 128B, collectively referred to as the interlocking components 128, that interlock with one another at a junction 132A. The second side 126B is made up of interlocking components 130A and 130B, collectively referred to as the interlocking components 130, that interlock with one another at a junction 132B. The junctions 132A and 132B are collectively referred to as the junctions 132.

The interlocking components 128 and 130 further minimize warping of the housing 105 during soldering of the leads 118 to the host PCB 102. This is because each interlocking component 128 and 130 independently and separately warps during such soldering. That is, the lengths of the sides 126 influenced by the mismatch between the CTE of the housing 105 and the CTE of the host PCB 102 are effectively shortened, since the side 126A is made up of two interlocking components 128, and the side 126B is made up of two interlocking components 130. The interlocking components 128 and 130 are thus adapted to further compensate for the mismatch between the CTE of the housing 105 and the CTE of the host PCB 102.

The junctions 132 also provide a keying feature of the housing 105 to aid proper insertion of the IC PCB 106 into the housing 105. The junctions 132 correspond to a notch 134 within the IC PCB 106. The notch 134 is not centered within the IC PCB 106; likewise, the junctions 132 are not centered on the sides 126 of the housing 105. As such, the IC PCB 106 can be inserted into the housing 105 in one particular way, due to the junctions 132 and the notch 134. When the IC PCB 106 is properly inserted into the housing 105, the notch 134 mates with the junctions 132. If the IC PCB 106 is attempted to be inserted backwards into the housing 105, the notch 134 will not align with the junctions 132, such that the IC PCB 106 will not be able to be fully inserted into the housing 105.

Figure 2A:
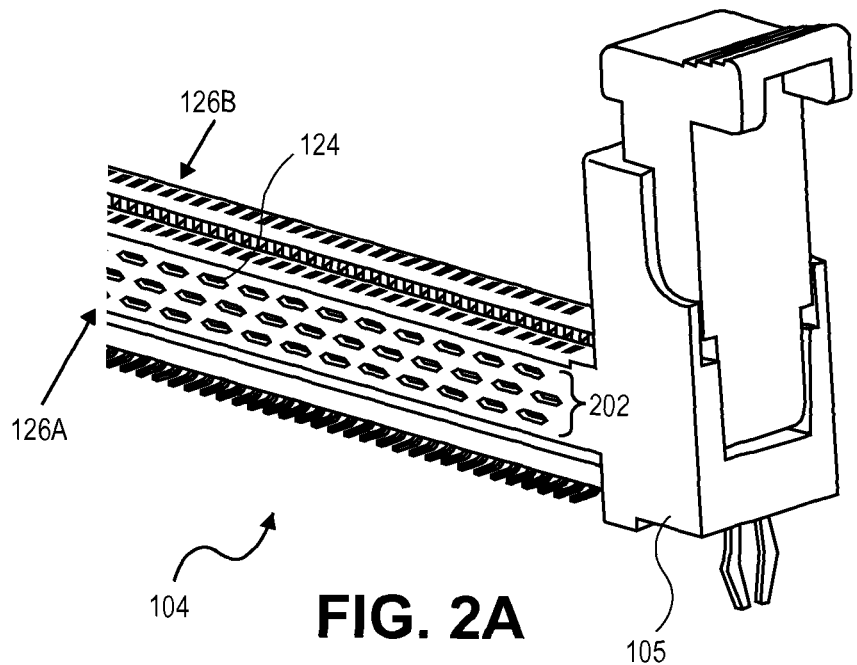
FIGS. 2A, 2B, 2C and 2D are diagrams of portions of a socket that illustrate different shapes and topologies of the socket's vents, according to varying embodiments of the invention.

FIG. 2A shows a portion of the socket 104 in detail, according to an embodiment of the invention. In FIG. 2A, the vents 124 are explicitly hexagon shaped, where the top and bottom sides of the hexagon are larger than the other four sides of the hexagon. It has been found that such hexagonally shaped vents 124 provide for optimal heat dissipation during soldering of the socket 104 to the host PCB 102. Furthermore, in FIG. 2A, the vents 124 are organized in a staggered manner over rows 202, in that the vents 124 of each row 202 are not aligned with the vents 124 of each adjacent row 202.

Figure 2B:
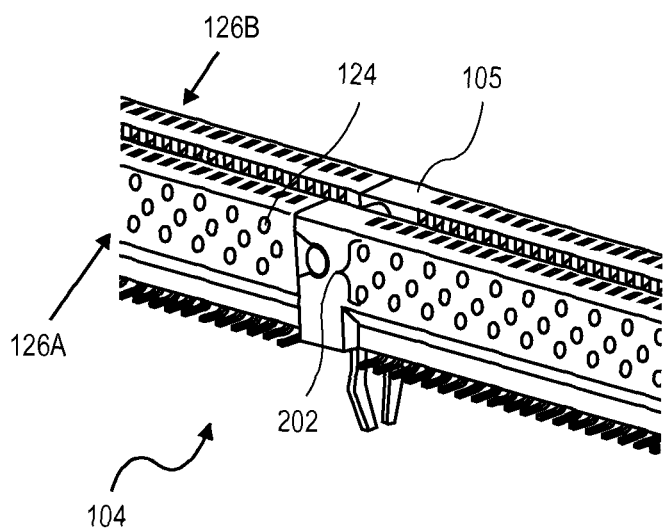
Figure 2C:
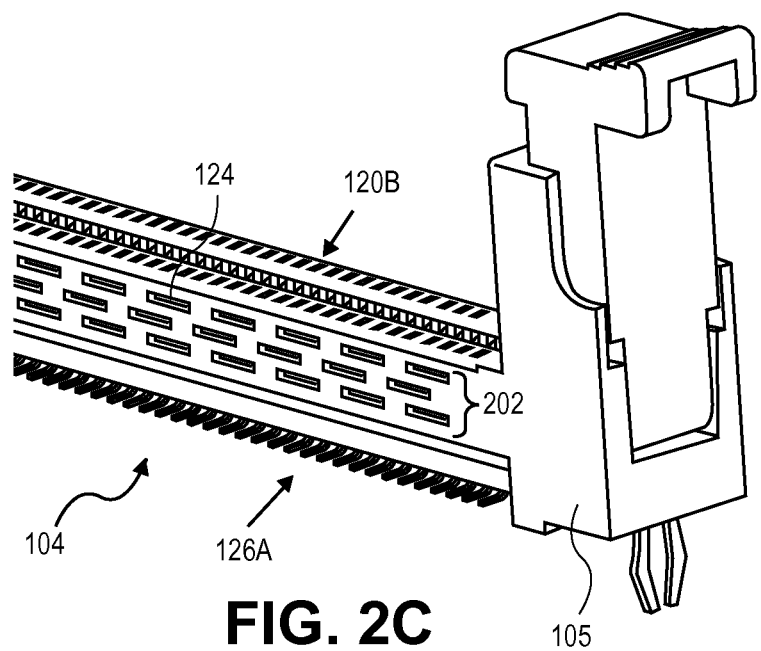
Figure 2D:
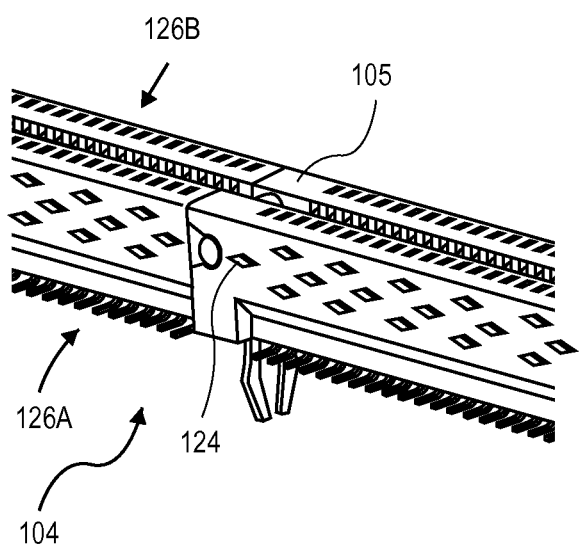

FIGS. 2B, 2C, and 2D show portions of the socket 104 in detail, according to other embodiments of the invention. In FIG. 2B, the vents 124 are oval shaped, whereas in FIG. 2C, the vents 124 are rectangle shaped. The vents 124 in FIGS. 2B and 2C are also organized in a staggered manner over rows 202. Finally, in FIG. 2D, the vents 124 are diamond shaped. In all of FIGS. 2A, 2B, 2C, and 2D, the vents 124 are located on either or both sides 126 of the housing 105. Furthermore, the vents 124 extend completely through the sides 126 of the housing 105. The vents 124 may further have shapes other than as depicted in FIGS. 2A-2D, such as circular shaped in one embodiment. Additionally, the vents 124 may be organized in a non-staggered manner, such as in an aligned manner in one embodiment.

Figure 3B:
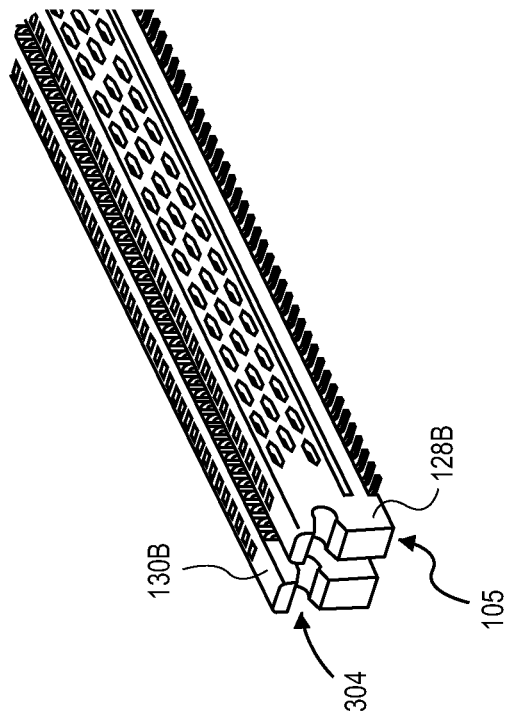
FIGS. 3A and 3B are diagrams of interlocking components of a socket, according to an embodiment of the invention.
Figure 3A:
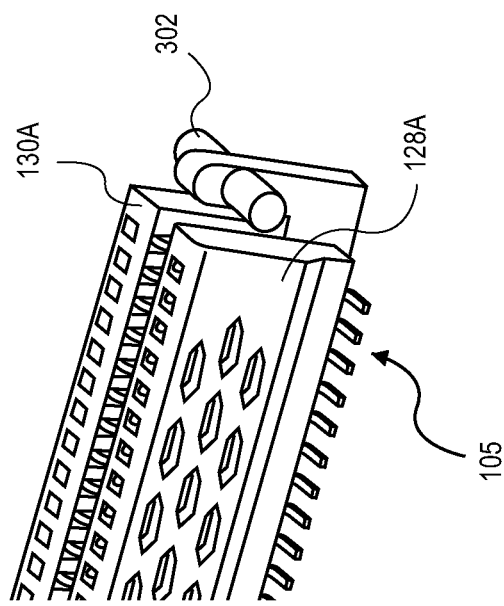

FIGS. 3A and 3B show portions of the housing 105 of the socket 104 in detail, according to an embodiment of the invention. The interlocking components 128A and 130A of the housing 105 are depicted in FIG. 3A, and the interlocking components 128B and 130B of the housing 105 are depicted in FIG. 3B. The interlocking components 128A and 130A of FIG. 3A include male interlocking mechanisms 302, whereas the interlocking components 128B and 130B of FIG. 3B include female interlocking mechanisms 304. The male interlocking mechanisms 302 mate with the female interlocking mechanisms 304 to interlock the components 128A and 130A of FIG. 3A with the components 128B and 130B of FIG. 3B. It is noted that as depicted in FIGS. 3A and 3B, the interlocking components 128 interlock with one another without assistance from any other part, and the interlocking components 130 also interlock with one another without assistance from any other part.

Figure 4:
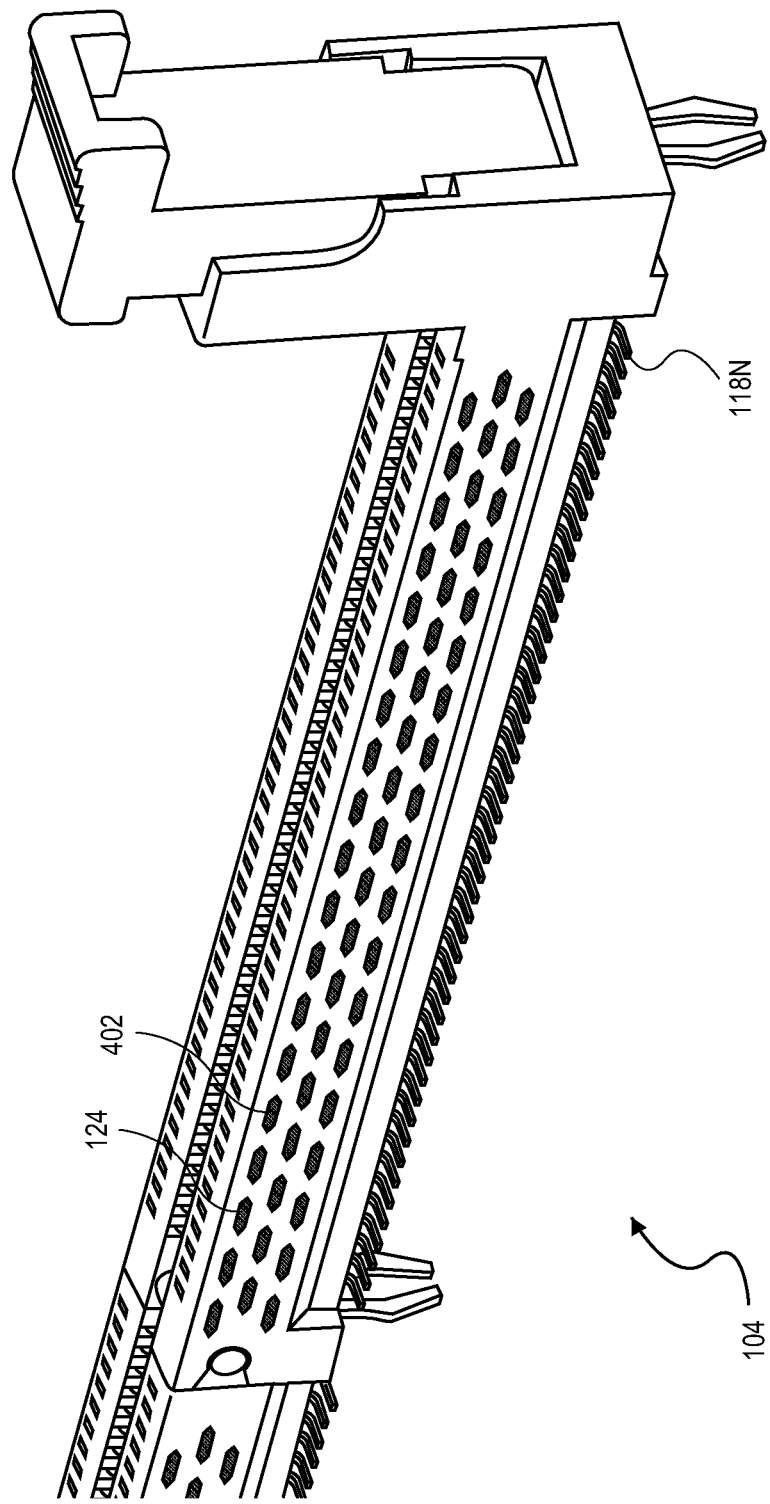
FIG. 4 is a diagram of a portion of a socket in which material is formed within the socket's vents, according to an embodiment of the invention.

FIG. 4 shows a portion of the socket 104 in detail, according to another embodiment of the invention. In FIG. 4, a material 402 is formed within the vents 124, such as by injection. The material 402 has a CTE that is tuned to the CTE of the host PCB 102, to minimize warping of the housing during soldering of the leads 118 to the host PCB. Thus, the embodiment of FIG. 4 differs from the embodiments of FIGS. 2A-2D in that the socket 104 of FIG. 4 is particular to the type of host PCB 102, whereas the socket 104 of FIGS. 2A-2D is not.

Figure 5:
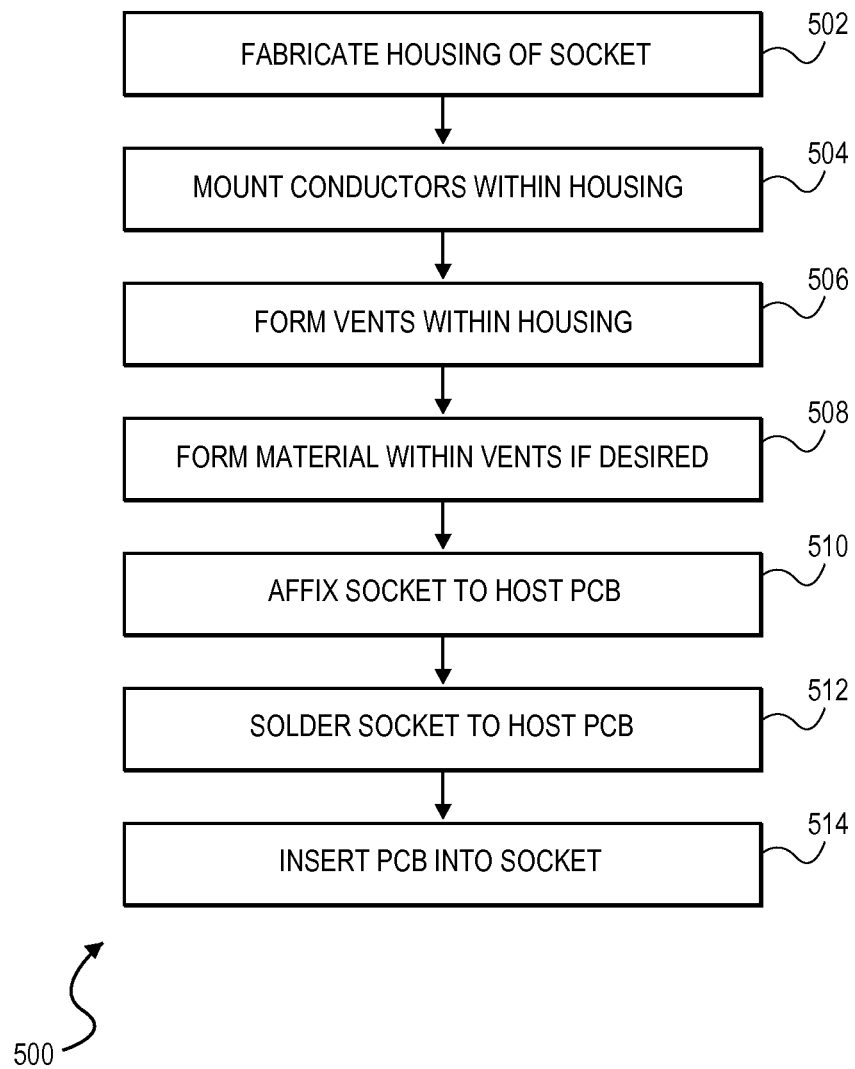
FIG. 5 is a flowchart of a method, according to an embodiment of the invention.

In conclusion, FIG. 5 shows a method 500, according to an embodiment of the invention. The housing 105 of the socket 104 is fabricated (502), such as by injection molding or another technique. The conductors 116 are mounted within the housing 105 (504). The vents 124 are formed within the housing 105 as well (506). It is noted that in one embodiment, the vents 124 may be formed at the same time the housing 105 is fabricated in part 502. In another embodiment, however, the vents 124 may be formed after the housing 105 has been fabricated in part 502. In either case, after the vents 124 have been formed, the material 402 is formed within the vents 124 if desired (508).

It is noted that the order in which the parts of the method 500 have are performed may vary from that depicted in FIG. 5. For example, the conductors 116 may be mounted within the housing 105 after the vents 124 are formed in part 506. As another example, the conductors 116 may further be mounted within the housing 105 after the material 402 has been formed within the vents 124, if desired, in part 508.

The socket 104 is affixed to the host PCB 102 (510), via the connectors 108 of the socket 104 being inserted into corresponding holes 110. The socket 104 is thereafter soldered to the host PCB 102 (512); specifically, the leads 118 of the socket 104 are soldered to the conductors 152 of the host PCB 102. The IC PCB 106 can then be inserted into the socket 104 (514), and secured via the releasable locks 122.

It is finally noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:

1. A socket receptive to insertion of an integrated circuit (IC) printed circuit board (PCB), comprising:
    a housing having a first side and a second side, the first side and the second side corresponding to a length of the IC PCB;
    a plurality of conductors mounted within the housing to mate with corresponding conductors of the IC PCB upon insertion of the IC PCB into the housing, the conductors having leads adapted to being soldered to corresponding conductors of a host PCB different than the IC PCB; and,
    a plurality of vents within the housing, the vents adapted to dissipate heat resulting from soldering the leads to the host PCB to minimize warping of the housing during soldering of the leads to the host PCB,
    wherein the vents are further adapted to compensate for a mismatch between a coefficient of thermal expansion (CTE) of the housing and a CTE of the host PCB during soldering of the leads to the host PCB, regardless of the CTE of the host PCB,
    wherein the housing comprises:
        a plurality of first interlocking components to form the first side of the housing, the first interlocking components to interlock with one another at one or more first junctions, and,
        a plurality of second interlocking components to form the second side of the housing, the second interlocking components to interlock with one another at one or more second junctions,
    wherein the first interlocking components and the second interlocking components are adapted to further minimize warping of the housing as a whole during soldering of the leads to the host PCB, due to each first interlocking component and each second interlocking component independently warping during soldering of the leads to the host PCB, wherein the first interlocking components and the second interlocking components are further adapted to further compensate for a mismatch between the CTE of the housing and the CTE of the host PCB during soldering of the leads to the host PCB, regardless of the CTE of the host PCB, and wherein lengths of the first side and the second side of the housing influenced by the mismatch between the CTE of the housing and the CTE of the host PCB are effectively shortened via the first interlocking components forming the first side of the housing and the second interlocking components forming the second side of the housing.

2. The socket of claim 1, wherein the first side and the second side of the housing are oriented perpendicular to the host PCB upon soldering of the leads to the host PCB, wherein the vents are located on one or more of the first side and the second side of the housing, and wherein the vents extend completely through the housing.

3. The socket of claim 1, wherein the vents are organized over a plurality of rows such that the vents are staggered from row to row in that the vents on any row are not aligned with the vents on an immediately adjacent row.

4. The socket of claim 1, wherein the vents each have a shape selected from a plurality of shapes comprising: a hexagon shape, a diamond shape, an oval shape, a circle shape, and a rectangular shape.

5. The socket of claim 1, wherein the first interlocking components are to directly interlock with one another without assistance from any other part, and wherein the second interlocking components are to directly interlock with one another without assistance from any other part.

6. The socket of claim 1, wherein the first junctions correspond to the second junctions, and wherein the first junctions and the second junctions provide a keying feature of the housing to aid proper insertion of the IC PCB into the housing.

7. The socket of claim 1, further comprising a material formed within the vents of the housing, wherein the material has a CTE tuned to the CTE of the host PCB to further minimize warping of the housing during soldering of the leads to the host PCB.

8. The socket of claim 7, wherein the material is injected into the vents of the housing.

9. The socket of claim 1, further comprising:

a plurality of connectors to mate with corresponding holes of the host PCB to attach the housing to the host PCB; and, a plurality of releasable locks movably attached within the housing to secure the IC PCB into the housing upon insertion of the IC PCB into the housing.

10. An electronic assembly comprising:

a host printed circuit board (PCB) having a plurality of conductors;

a socket receptive to insertion of an integrated circuit (IC) PCB and comprising:

a housing having a first side and a second side, the first side and the second side corresponding to a length of the IC PCB;

a plurality of conductors mounted within the housing to mate with corresponding conductors of the IC PCB upon insertion of the IC PCB into the housing, the conductors having leads soldered to the conductors of the host PCB; and, a plurality of vents within the housing, the vents adapted to dissipate heat resulting from soldering the leads to the host PCB to minimize warping of the housing during soldering of the leads to the host PCB, wherein the vents are further adapted to compensate for a mismatch between a coefficient of thermal expansion (CTE) of the housing and a CTE of the host PCB during soldering of the leads to the host PCB, regardless of the CTE of the host PCB, wherein the housing comprises:

a plurality of first interlocking components to form the first side of the housing, the first interlocking components to interlock with one another at one or more first junctions, and, a plurality of second interlocking components to form the second side of the housing, the second interlocking components to interlock with one another at one or more second junctions, wherein the first interlocking components and the second interlocking components are adapted to further minimize warping of the housing as a whole during soldering of the leads to the host PCB, due to each first interlocking component and each second interlocking component independently warping during soldering of the leads to the host PCB, wherein the first interlocking components and the second interlocking components are further adapted to further compensate for a mismatch between the CTE of the housing and the CTE of the host PCB during soldering of the leads to the host PCB, regardless of the CTE of the host PCB, and wherein lengths of the first side and the second side of the housing influenced by the mismatch between the CTE of the housing and the CTE of the host PCB are effectively shortened via the first interlocking components forming the first side of the housing and the second interlocking components forming the second side of the housing.

11. The electronic assembly of claim 10, wherein the first side and the second side of the housing are oriented perpendicular to the host PCB upon soldering of the leads to the host PCB, wherein the vents are located on one or more of the first side and the second side of the housing, and wherein the vents extend completely through the housing.

12. The electronic assembly of claim 10, wherein the vents are organized over a plurality of rows such that the vents are staggered from row to row in that the vents on any row are not aligned with the vents on an immediately adjacent row.

13. The electronic assembly of claim 10, wherein the vents each have a shape selected from a plurality of shapes comprising: a hexagon shape, a diamond shape, an oval shape, a circle shape, and a rectangular shape.

14. The electronic assembly of claim 10, wherein the first interlocking components are to directly interlock with one another without assistance from any other part, and wherein the second interlocking components are to directly interlock with one another without assistance from any other part.

15. The electronic assembly of claim 10, wherein the first junctions correspond to the second junctions, and wherein the first junctions and the second junctions provide a keying feature of the housing to aid proper insertion of the IC PCB into the housing.

16. The electronic assembly of claim 10, further comprising a material formed within the vents of the housing, wherein the material has a CTE tuned to the CTE of the host PCB to further minimize warping of the housing during soldering of the leads to the host PCB.

17. The electronic assembly of claim 16, wherein the material is injected into the vents of the housing.

* * * * *